(12) United States Patent
Lee et al.

(10) Patent No.: US 7,939,452 B2
(45) Date of Patent: May 10, 2011

(54) METHOD OF MANUFACTURING TRANSISTOR HAVING METAL SILICIDE AND METHOD OF MANUFACTURING A SEMICONDUCTOR DEVICE USING THE SAME

(75) Inventors: Jung-Deog Lee, Yongin-si (KR); Ki-Chul Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 12/320,604

(22) Filed: Jan. 30, 2009

(65) Prior Publication Data

US 2009/0203182 A1    Aug. 13, 2009

(30) Foreign Application Priority Data

Jan. 30, 2008    (KR) ................ 10-2008-0009588

(51) Int. Cl.
*H01L 21/302* (2006.01)
*H01L 21/461* (2006.01)

(52) U.S. Cl. .. 438/721; 438/664; 438/682; 257/E21.622

(58) Field of Classification Search .................. None
See application file for complete search history.

(56) References Cited

U.S. PATENT DOCUMENTS

| 7,678,704 B2* | 3/2010 | Klee et al. ................... 438/705 |
| 2004/0198041 A1 | 10/2004 | Shin et al. |
| 2007/0087542 A1* | 4/2007 | Huang et al. ................ 438/592 |
| 2009/0032766 A1* | 2/2009 | Rajaratnam et al. ......... 252/79.1 |

FOREIGN PATENT DOCUMENTS

| KR | 10-2004-0043675 | 5/2004 |
| KR | 10-2006-0006537 | 1/2006 |
| KR | 10-2007-0003021 | 1/2007 |

\* cited by examiner

*Primary Examiner* — Jarrett J Stark
(74) *Attorney, Agent, or Firm* — Harness, Dickey & Pierce, PLC

(57) ABSTRACT

In a method of manufacturing a transistor and a method of manufacturing a semiconductor device using the same, the method may include forming a preliminary metal silicide pattern on a single-crystalline silicon substrate and on a polysilicon pattern, and partially etching the preliminary metal silicide pattern to form a first metal silicide pattern on the substrate and a second metal silicide pattern on the polysilicon pattern, the second metal silicide pattern having a line width the same as or smaller than that of the polysilicon pattern. The method may include the transistor having no metal silicide residue on the spacer. Accordingly, an operation failure due to the residue may be prevented or reduced.

19 Claims, 8 Drawing Sheets

METHOD OF MANUFACTURING TRANSISTOR HAVING METAL SILICIDE AND METHOD OF MANUFACTURING A SEMICONDUCTOR DEVICE USING THE SAME

PRIORITY STATEMENT

This application claims priority under U.S.C. §119 to Korean Patent Application No. 10-2008-0009588, filed on Jan. 30, 2008, in the Korean Intellectual Property Office (KIPO), the entire contents of which are incorporated herein by reference.

BACKGROUND

1. Field

Example embodiments relate to a method of manufacturing a transistor having metal silicide and a method of manufacturing a semiconductor device using the same. More particularly, example embodiments relate to a method of manufacturing a transistor including a gate having a stacked structure of polysilicon and metal silicide and a method of manufacturing a semiconductor device using the same.

2. Description of the Related Art

In an information society, in order to rapidly process relatively large amounts of data, highly integrated semiconductor devices having high data transmission speeds may be required. However, as the semiconductor devices become highly integrated, ensuring required characteristics of the semiconductor devices becomes more difficult.

For example, gate lengths and junction depths of sources/drains in the semiconductor devices are being reduced, thereby causing increases in the resistances of the gates and the source/drain regions. The increases in the resistances cause deterioration of the high speed operation of the semiconductor devices and cause undesirable power consumption.

In order to improve the problem, a method of forming a metal silicide layer including compounds of metal and silicon on the gate electrode and the source/drain region has been used. The metal silicide layer may include a tungsten silicide layer, a titanium silicide layer, a cobalt silicide layer and a nickel silicide layer. Among them, the nickel silicide layer may have a lower silicon consumption rate and a lower specific resistance. Also, the nickel silicide layer having a line width of less than 0.1 µm may maintain uniform surface resistance and the nickel silicide layer may be more easily formed at a relatively low temperature. Thus, nowadays, the nickel silicide layer may be actively employed in highly integrated semiconductor devices, e.g., a nano-CMOS transistor.

Generally, a gate electrode having the metal silicide layer may have a stacked structure of polysilicon and metal silicide. An insulation layer spacer may be provided on sidewalls of the gate electrode so as not to form the metal silicide on the sidewalls of the gate electrode. However, when the gate electrode having the metal silicide may be formed, a silicidation reaction may occur so rapidly that the metal silicide layer grows to the upper surface of the spacer at a lateral side of the gate electrode. In example embodiments, unnecessary metal silicide residue may be frequently formed on the upper surface of the spacer. Particularly, when the nickel silicide is used for the metal silicide, the metal silicide residue frequently occurs due to thermal instability of nickel silicide.

The metal silicide residue may be formed along the upper surface of the spacer, thereby causing a short failure between the gate electrode and a contact plug connected to the source/drain of the transistor. Further, when the contact plug is misaligned to be closely adjacent to the gate electrode, short failures between the gate electrode and the contact plug may occur more frequently.

SUMMARY

Example embodiments provide a method of forming a capacitor having increased capacitance, the method being capable of reducing the number of unit processes. Example embodiments provide a method of manufacturing a semiconductor device including a capacitor having increased capacitance, the method being capable of reducing the number of unit processes.

According to example embodiments, in a method of manufacturing a transistor, a preliminary metal silicide pattern may be formed on a substrate and on a polysilicon pattern. Forming a first metal silicide pattern on the substrate and a second metal silicide pattern on the polysilicon pattern may include partially etching the preliminary metal silicide pattern, the second metal silicide pattern having a line width the same as or smaller than that of the polysilicon pattern.

In example embodiments, a gate insulation layer pattern and the polysilicon pattern may be formed on the substrate. A spacer may be formed on sidewalls of the polysilicon pattern. Impurity regions may be formed under surfaces of the substrate on both sides of the spacer. In example embodiments, the method may further include forming an offset insulation layer on the polysilicon pattern and on the surface of the substrate and forming a low concentration impurity region by implanting impurities under the surface of the substrate on either side of the polysilicon pattern.

In example embodiments, the method may further include forming an etch mask pattern to cover the preliminary metal silicide pattern on the substrate on both sides of the spacer, the etch mask pattern exposing the preliminary metal silicide pattern on the polysilicon pattern. Forming the etch mask pattern may include coating a mask layer on the substrate on both sides of the spacer, the mask layer including organic material used for a reflection-protection layer and partially removing the mask layer by an etch-back process to expose the preliminary metal silicide pattern on the polysilicon pattern.

Alternatively, forming the etch mask pattern may include coating a mask layer on the substrate on both sides of the spacer, the mask layer including photoresist and partially removing the mask layer by a photolithography process to expose the preliminary metal silicide pattern on the polysilicon pattern. In example embodiments, partially etching the preliminary metal silicide pattern may include removing metal silicide residue on the spacer in the lateral direction of the polysilicon pattern. In example embodiments, the preliminary metal silicide pattern may be etched by an anisotropic etch process.

The anisotropic etch process may be performed through a plasma dry etch process including introducing an etching gas under a pressure of about 50 mTorr to about 150 mTorr. In example embodiments, the preliminary metal silicide pattern may include nickel silicide, cobalt silicide, tungsten silicide, or titanium silicide. In example embodiments, forming the preliminary metal silicide pattern may include forming a metal layer on the polysilicon pattern, the spacer and the substrate, reacting the metal layer with silicon to form a metal silicide on the polysilicon pattern and on the surface of the substrate and removing unreacted metal layer from the substrate.

According to example embodiments, in a method of manufacturing a semiconductor device, a gate insulation layer pattern and a polysilicon pattern may be formed on a substrate. A spacer may be formed on sidewalls of the polysilicon pattern. Impurity regions may be formed by implanting impurities under surfaces of the substrate on both sides of the spacer. A first metal silicide pattern may be formed on the substrate and a preliminary second metal silicide pattern may be formed on the polysilicon pattern. Forming a second metal silicide patter on the polysilicon pattern may include partially etching the preliminary second metal silicide pattern to remove metal silicide residue on the spacer in the lateral direction of the polysilicon pattern. An insulation interlayer may be formed to cover the second metal silicide pattern, the spacer and the substrate. A contact plug penetrating the insulation interlayer may be formed to be connected to the first metal silicide pattern.

In example embodiments, the method may further include forming an etch mask pattern to cover the first metal silicide pattern formed on the substrate, the etch mask pattern exposing the preliminary second metal silicide pattern formed on the polysilicon pattern. The etch mask pattern may be formed using organic material used for a reflection-protection layer or photoresist. The method may further include removing the etch mask pattern after forming the second metal silicide pattern. The etch mask pattern may be removed by a wet etching process and an ashing process.

In example embodiments, the preliminary second metal silicide pattern may be etched by an isotropic etch process. The anisotropic etch process may be performed through a plasma dry etch process including introducing an etching gas under a pressure of about 50 mTorr to about 150 mTorr.

The preliminary second metal silicide pattern may include nickel silicide and the etching gas may include trifluoromethane ($CHF_3$), difluoromethane ($CH_2F_2$), or fluoromethane ($CH_3F$). These may be used alone or in a combination thereof. The etching gas may further include oxygen gas. In example embodiments, the method may further include forming a liner layer under the insulation interlayer to cover the second metal silicide pattern, the spacer and the substrate.

According to example embodiments, a transistor may include a gate insulation layer pattern and a polysilicon pattern on a single-crystalline silicon substrate, a spacer on sidewalls of the polysilicon pattern, impurity regions under surfaces of the substrate on both sides of the polysilicon pattern, a first metal silicide pattern on the surface of the substrate and a second metal silicide pattern on the polysilicon pattern, the second metal silicide pattern having a line width the same as or smaller than that of the polysilicon pattern. In example embodiments, the first and second metal silicide patterns may include nickel silicide, cobalt silicide, tungsten silicide and titanium silicide.

According to example embodiments, a method of manufacturing a transistor may include forming a gate structure having a polysilicon pattern and a metal silicide pattern. The metal silicide pattern may be also provided on an impurity region. Therefore, the gate and the impurity region of the transistor may have a reduced resistance. Further, the metal silicide pattern on the polysilicon pattern may have a line width the same as or smaller than that of the polysilicon pattern and the gate may have no metal silicide residue in the lateral direction of the polysilicon pattern. Accordingly, an operation failure due to the residue may be prevented or reduced.

BRIEF DESCRIPTION OF THE DRAWINGS

Example embodiments will be more clearly understood from the following detailed description taken in conjunction with the accompanying drawings.

FIG. 1 is a cross-sectional view illustrating a transistor in accordance with example embodiments.

FIGS. 2 to 8 are cross-sectional views illustrating a method of manufacturing the transistor in FIG. 1.

FIG. 9 is a cross-sectional view illustrating a method of manufacturing the transistor in FIG. 1 in accordance with example embodiments.

FIGS. 10 to 12 are cross-sectional views illustrating a method of manufacturing a semiconductor device in accordance with example embodiments.

Figure 1:
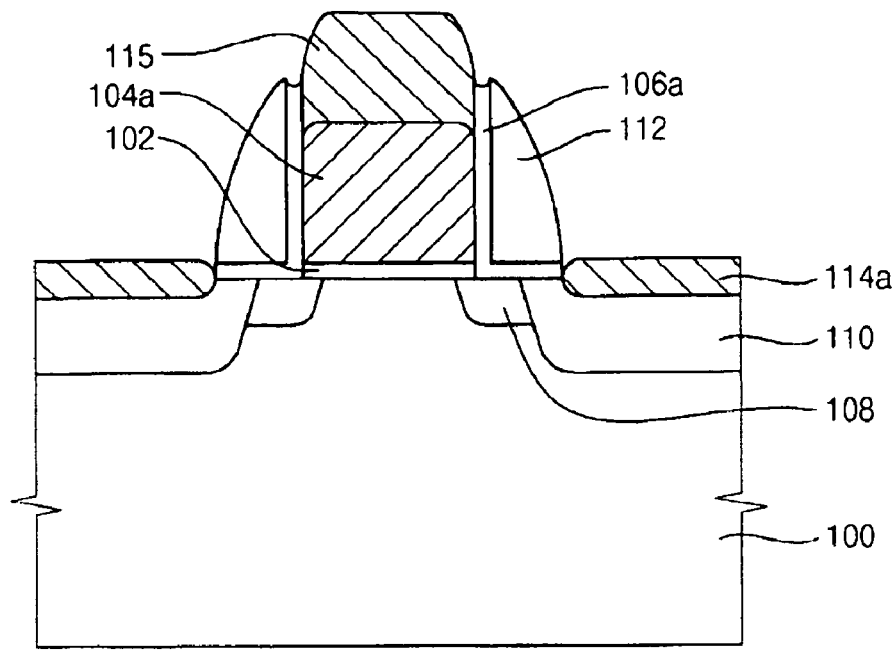
FIGS. 1-11 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures.

It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying drawings.

FIG. 1 is a cross-sectional view illustrating a transistor in accordance with example embodiments. Referring to FIG. 1, a gate insulation layer pattern 102 and a polysilicon pattern 104a may be formed on a single-crystalline silicon substrate 100. The gate insulation layer pattern 102 may include silicon oxide formed by a thermal oxidation process. The polysilicon pattern 104a may be doped with n-type impurities or p-type impurities.

An offset spacer 106a may be provided on sidewalls of the polysilicon pattern 104a and on a surface portion of the substrate. The offset spacer 106a may include silicon oxide. A spacer 112 may be provided on the offset spacer 106a. The spacer 112 may include silicon nitride. First impurity regions 108 having relatively low impurity concentrations may be provided under the surfaces of the substrate on both sides of the polysilicon pattern 104a. Second impurity regions 110 having relatively high impurity concentrations may be provided under the surface of the substrate on both sides of the spacer 112.

A first metal silicide pattern 114a may be provided on the surface of the substrate 100 on both sides of the spacer 112. The first metal silicide pattern 114a may make contact with the upper surface of the second impurity region 110. The first metal silicide pattern 114a may include nickel silicide, cobalt silicide, tungsten silicide, or titanium silicide. These may be used alone. Alternatively, the first metal silicide pattern 114a may be a multilayer structure having two or more layers thereof. In example embodiments, the first metal silicide pattern 114a may include nickel silicide having relatively low resistance.

A second metal silicide pattern 115 may be provided on the polysilicon pattern 104a. The second metal silicide pattern 115 may have a line width the same as or smaller than that of the polysilicon pattern 104a. The upper surface of the second metal silicide pattern 115 may be higher than that of the spacer. The second metal silicide pattern 115 may include the same material as the first metal silicide pattern 114a. Accordingly, in example embodiments, the second metal silicide pattern 115 may include nickel silicide.

When a line width of the second metal silicide pattern 115 is increased, a misalignment margin between a gate and adjacent conductive patterns or contacts may be reduced, thereby causing a short failure. However, in example embodiments, because the second metal silicide pattern 115 has a line width the same as or smaller than that of the polysilicon pattern 104a, a short failure between adjacent patterns may be reduced more efficiently as compared with when the second metal silicide pattern 115 may have a line width greater than that of the polysilicon pattern 104a.

As illustrated in the figure, a gate included in a transistor of example embodiments may have no metal silicide residue on a surface of the spacer on a side of the polysilicon pattern. Accordingly, failures due to the metal silicide residue to be formed on the surface of the spacer may be prevented or reduced.

Figure 2:
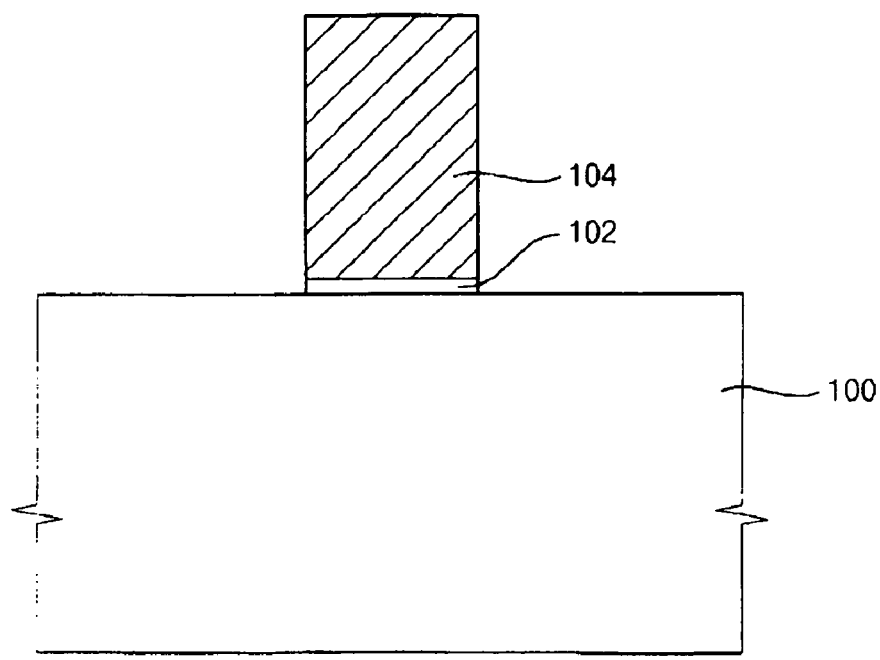

FIGS. 2 to 8 are cross-sectional views illustrating a method of manufacturing the transistor in FIG. 1. Referring to FIG. 2, a gate insulation layer (not illustrated) and a polysilicon layer (not illustrated) may be sequentially deposited on a single-crystalline silicon substrate 100. The gate insulation layer and the polysilicon layer may be patterned by a photolithography process to form a gate insulation layer pattern 102 and a preliminary polysilicon pattern 104.

Figure 3:
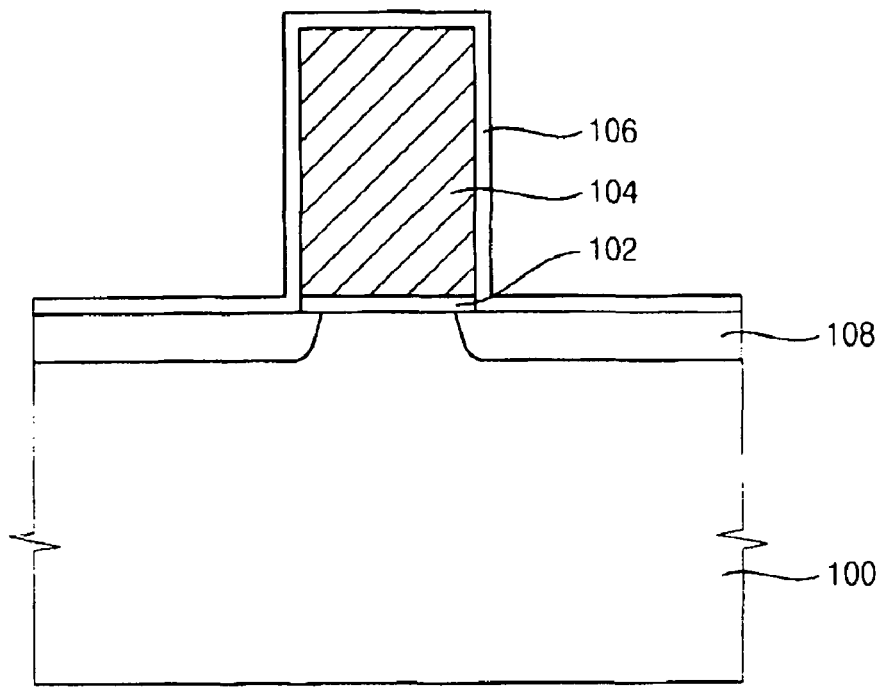

Referring to FIG. 3, a first insulation layer 106 for an offset spacer may be formed on surfaces of the preliminary polysilicon pattern 104 and the substrate 100. The first insulation layer 106 may be formed using silicon oxide by a chemical vapor deposition (CVD) process. Impurities may be implanted into the surface of the substrate 100 including the first insulation layer 106 formed thereon, to form first impurity regions 108 having a relatively low impurity concentration. A thermal treatment process may be further performed on the substrate to activate the doped impurities in the first impurity region 108.

The first insulation layer 106 may prevent or reduce the impurities from diffusing undesirably or excessively in the lateral direction that the first impurity region 108 extends adjacent to the middle portion of the preliminary polysilicon pattern 104. As the thickness of the first insulation layer 106 may be controlled, an edge position of the first impurity region 108 may be controlled, and thus, the channel length of a transistor may be controlled.

However, where the preliminary polysilicon pattern 104 has a relatively large line width, even though the impurities diffuse laterally, the channel length may not be greatly affected by the diffusion. Accordingly, in example embodiments, the process of forming the first insulation layer 106 may be omitted.

Figure 4:
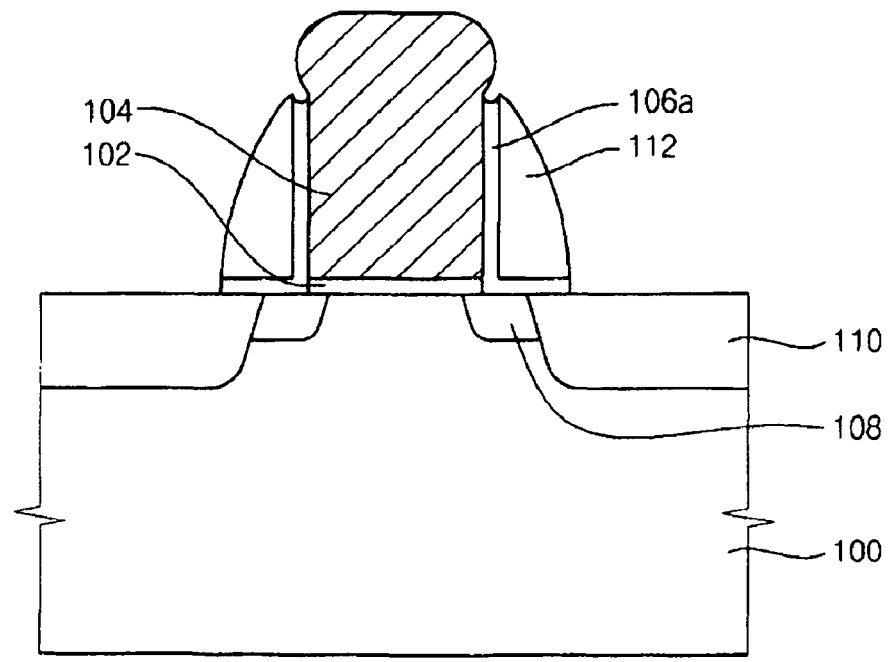

Referring to FIG. 4, a second insulation layer (not illustrated) for a spacer may be formed on the first insulation layer 106. The second insulation layer may be formed using silicon nitride. The second insulation layer may be formed by a low pressure CVD process. The second insulation layer may be anisotropically etched to form a spacer 112 on sidewalls of the preliminary polysilicon pattern 104.

In the anisotropic etch process, portions of the second insulation layer on the surface of the substrate 100 and a portion of the second insulation layer on the preliminary polysilicon pattern 104 may be completely removed. However, the etch process may not be easily controlled, thereby leaving the second insulation layer only on the sidewalls of the preliminary polysilicon pattern 104, while the second insulation layer on the surface of the substrate 100 and on the preliminary polysilicon pattern 104 may be completely removed. Accordingly, the second insulation layer may need to be excessively etched so as to completely remove the second insulation layer on the surface of the substrate 100 and on the preliminary polysilicon pattern 104, and thus, the spacer 112 may be formed only on lower sidewalls of the preliminary polysilicon pattern 104. Thus, the upper surface of the preliminary polysilicon pattern 104 may be positioned higher than the upper surface of the spacer 112. Therefore, the upper portion of the preliminary polysilicon pattern 104 may protrude from the spacer 112.

Impurities may be implanted into the surface of the substrate 100 on both sides of the spacer 112 using the spacer 112 as an ion implanting mask to form a second impurity region 110 having a greater impurity concentration than the first impurity region 108. A thermal treatment process may be further performed on the substrate to activate the doped impurities in the second impurity region 110.

In the process of forming the second impurity region 110, the impurities may be implanted into the surface of the substrate 100 using relatively high level energy to form the second impurity region 110. Therefore, by the ion implanting process, the portion of the preliminary polysilicon pattern 104 protruding highly from the spacer 112 may recrystallize to extend laterally, and thus, the protruding upper portion of the preliminary polysilicon pattern 104 may have a line width greater than that of the lower portion of the preliminary polysilicon pattern 104 surrounded by the spacer. The upper portion of the preliminary polysilicon pattern 104 may have an arc shape.

After forming the second impurity region 110, the first insulation layer 106 remaining on the surface of the substrate 100 and on the sidewalls of the protruding preliminary polysilicon pattern 104 and contaminants may be completely removed. The portion of the first insulation layer 106 may be removed to form an offset spacer 106a on the sidewalls of the preliminary polysilicon pattern 104 and on the surface of the substrate 100.

Figure 5:
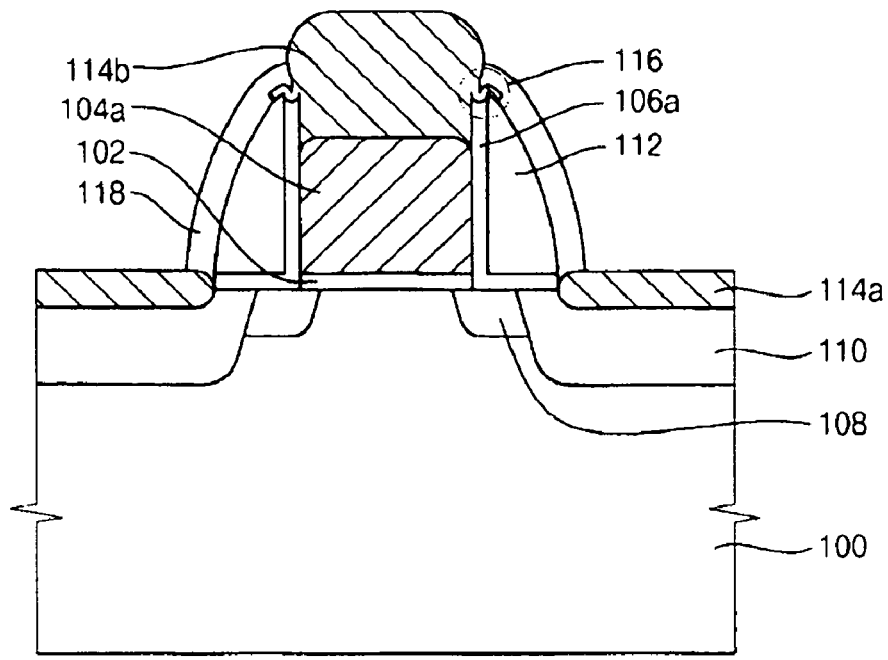

Referring to FIG. 5, a metal layer (not illustrated) may be formed on the substrate 100, the spacer 112 and the preliminary polysilicon pattern 104. The metal layer may be used to form a metal silicide by a following process. For example, the metal layer may be formed using nickel, cobalt, tungsten, or titanium. In example embodiments, the metal layer may be formed using nickel.

The metal layer may be reacted with silicon by a thermal treatment process, to form a first metal silicide pattern 114a on the substrate 100 and a preliminary second metal silicide pattern 114b on a polysilicon pattern 104a. In the process of forming the preliminary second metal silicide pattern 114b, the preliminary polysilicon pattern 104 may be reacted with the metal, and thus, may be changed into the polysilicon pattern 104a having a reduced height. In example embodiments, the polysilicon pattern 104a may have an upper surface lower than that of the spacer 112. Because the metal layer 118 formed on the spacer is not reacted with the silicon, the metal layer 118 on the spacer may still remain. The thermal treatment process for forming the first metal silicide pattern 114a and the preliminary second metal silicide pattern 114b may be performed twice over the substrate.

For example, after a first thermal treatment process is performed on the metal layer, a second thermal treatment process may be performed on the metal layer in-situ. The first thermal treatment process may be performed at a temperature of about 300° C. to about 600° C., for example, about 300° C. to about 400° C. The second thermal treatment may be performed at a temperature lower than the first thermal treatment, for example, at a temperature of about 200° C. to about 300° C. The second thermal treatment may be performed for about 10 minutes or more, for example, about 10 minutes to about 30 minutes. In example embodiments, the metal layer, e.g., the nickel layer, on the surface of the substrate 100 and on the polysilicon pattern 104a may be reacted with silicon atoms to be changed into di-nickel silicide ($Ni_2Si$) or nickel monosilicide (NiSi).

In example embodiments, due to thermal instability of nickel silicide, defects may occur in the surface of the nickel silicide pattern, and thus, the nickel silicide pattern may have rough surface morphology. Further, because the upper portion of the preliminary polysilicon pattern 104 has the laterally extended shape, the preliminary polysilicon pattern 104 may continue to extend in the lateral direction by the silicidation reaction to thereby form a residue 116 on the spacer 112. The nickel silicide residue 116 may depend on a temperature and a time of the thermal treatment process for the silicidation reaction. Further, the nickel silicide residue may depend on impurity ions, especially the residue which may occur frequently in an n-type impurity-doped gate of an n-type metal-oxide semiconductor (NMOS) transistor.

Figure 6:
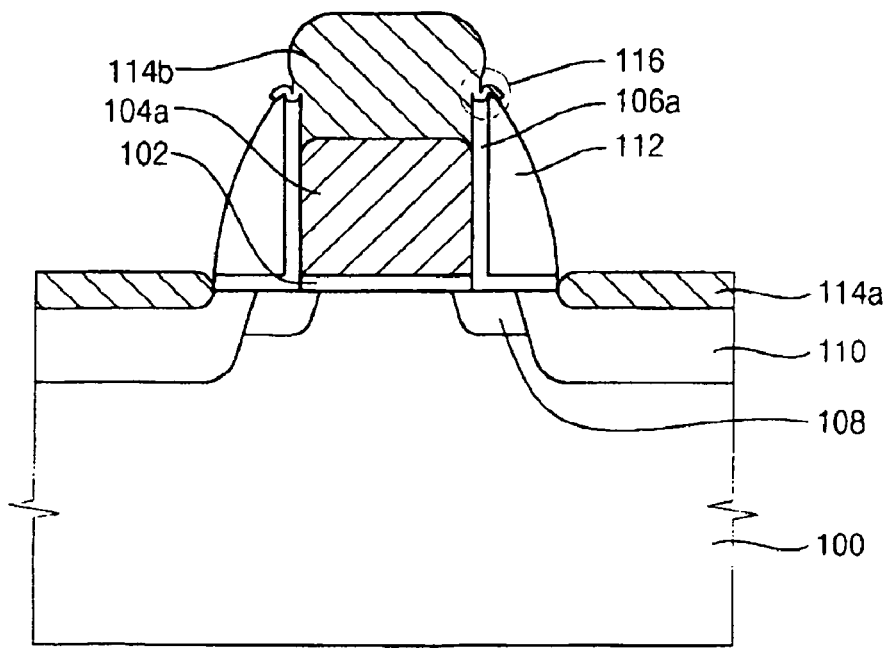

Referring to FIG. 6, the unreacted metal layer 118 may be removed from the substrate. For example, the unreacted metal layer 118 may be removed using a mixture solution of sulfuric acid ($H_2SO_4$) and hydrogen peroxide ($H_2O_2$). After the unreacted metal layer 118 is removed, the first metal silicide pattern 114a may remain on the surface of the substrate 100, and the preliminary second metal silicide pattern 114b may remain on the polysilicon pattern 104a.

As illustrated in the figures, the preliminary second metal silicide pattern 114b may have a line width greater than that of the lower polysilicon pattern 104a. The line width of the upper portion of the preliminary polysilicon pattern 104 protruding from the spacer 112 may be greater than the line width of the lower portion of the preliminary polysilicon pattern 104 surrounded by the spacer 112.

Figure 7:
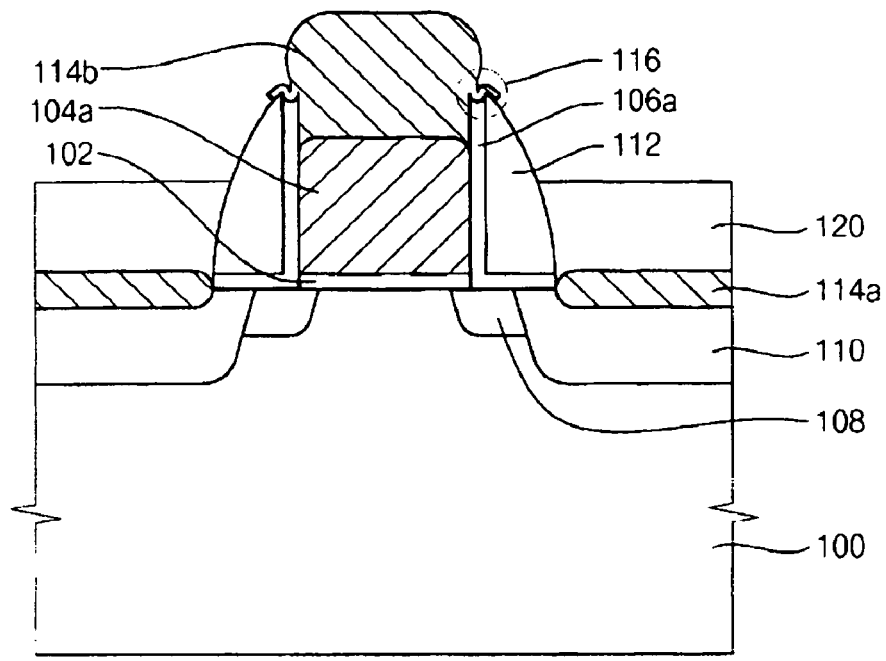

Referring to FIG. 7, a mask layer (not illustrated) may be coated on the first metal silicide pattern 114a on both sides of the spacer 112. The mask layer may be formed using organic material by a spin-coating process or a deposition process. The mask layer may be formed using organic material used for a reflection-protection layer or photoresist. An example of the organic material used for a reflection-protection layer may be an organic compound including mainly novolac-type epoxy resin, e.g., ODL (trade name, produced by JSR Co., Ltd.)

The mask layer may be partially removed to form an etch mask pattern 120 to expose the preliminary second metal silicide pattern 114b on the polysilicon pattern 104a. The etch mask pattern 120 may cover the first metal silicide pattern 114a formed on both sides of the spacer 112.

When the mask layer is formed using photoresist, the etch mask pattern 120 may be formed by a photolithography process. After photoresist is coated on the substrate 1(X), the photoresist film may be partially removed to expose the preliminary second metal silicide pattern 114b on the polysilicon pattern 104a, to form the etch mask pattern 120.

Alternatively, the mask layer may be formed using organic material used for a reflection-protection layer, the etch mask pattern 120 may be formed by an etch-back process. After organic material used for a reflection-protection layer is coated on the substrate 110 on both sides of the spacer 112, the coated organic material layer may be partially etched back to expose the preliminary second metal silicide pattern 114b, to form the etch mask pattern 120.

Figure 8:
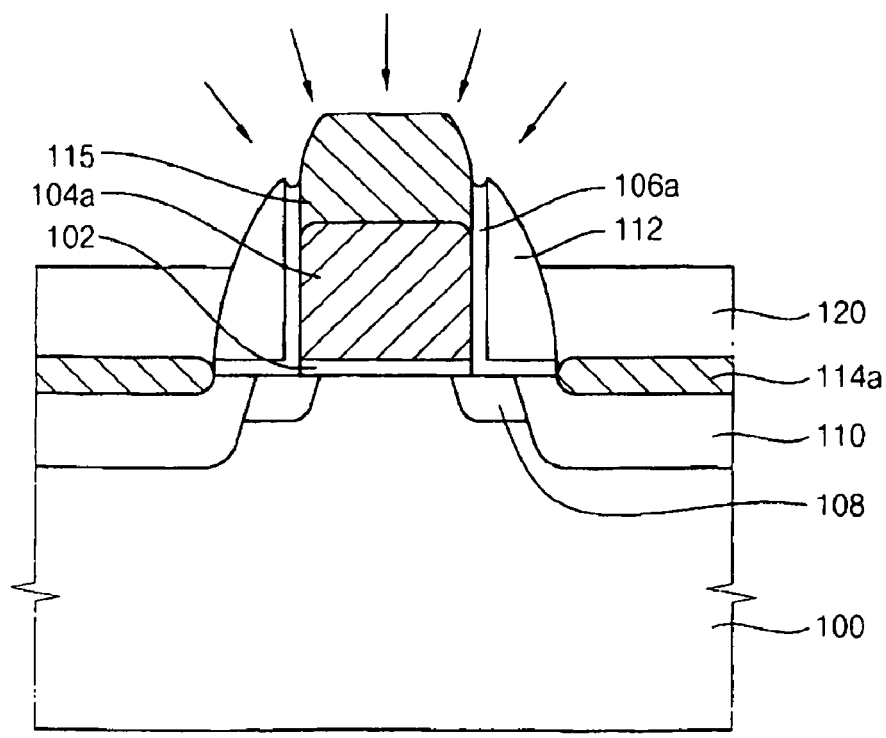

Referring to FIG. 8, the preliminary second metal silicide pattern 114b may be partially etched using the etch mask pattern 120 to form a second metal silicide pattern 115 having a line width the same as or smaller than that of the lower polysilicon pattern 104a. The metal silicide residue (116, see FIG. 7) formed on the spacer 112 may be completely removed by the etch process.

In order for the metal silicide residue 116 to be completely removed through the etch process and the second metal silicide pattern to be formed to have a line width the same as or smaller than that of the lower polysilicon pattern 104a, the sidewall portions of the preliminary second metal silicide pattern 114b may be partially removed. Therefore, the etch process may include an isotropic etch process.

The etch process may be performed through a plasma dry etch process in which an etching gas may be introduced under a pressure of about 50 mTorr to about 150 mTorr. In example embodiments, the preliminary second metal silicide pattern may be isotropically etched without applying bias to the substrate. In example embodiments, when the preliminary second metal silicide pattern 114b is the nickel silicide pattern, examples of the etching gas may be trifluoromethane ($CHF_3$), difluoromethane ($CH_2F_2$), or fluoromethane ($CH_3F$). These may be used alone or in a combination thereof. Oxygen gas may be further used as an additional etching gas. The etch mask pattern 120 may be removed from the substrate to form a transistor illustrated in FIG. 1. The etch mask pattern 120 may be removed by an ashing process or a wet etching process.

Figure 9:
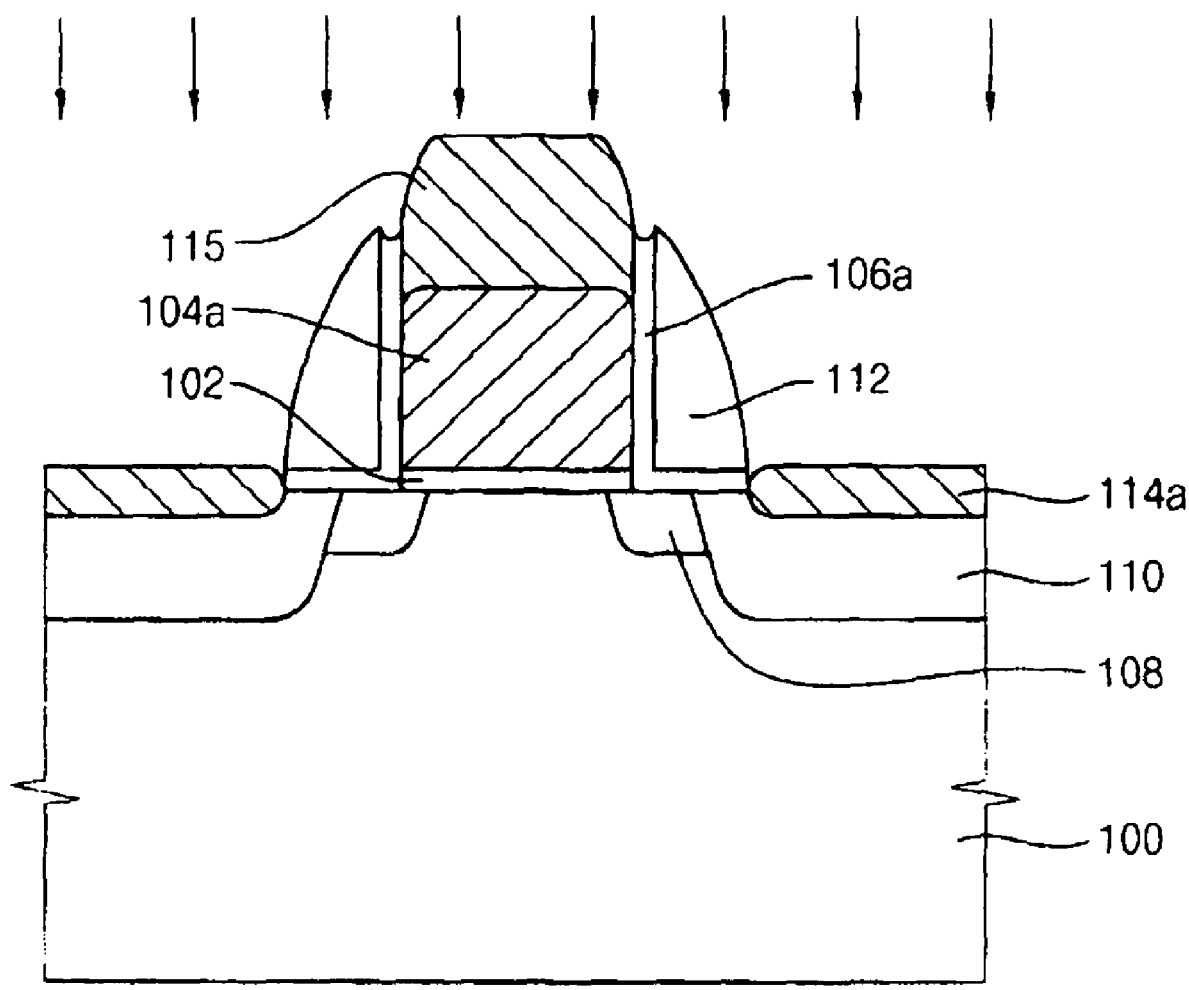

FIG. 9 is a cross-sectional view illustrating a method of manufacturing a transistor in FIG. 1 in accordance with example embodiments. A method to be explained below may be the same as the method explained with reference to FIGS. 2 to 8, except that, before isotropically etching a silicide pattern, a process of forming an etch mask pattern may be omitted. The same processes as illustrated in FIGS. 2 to 6 may be performed on the substrate to form a preliminary first metal silicide pattern and a preliminary second metal silicide pattern on the polysilicon pattern 104a. In example embodiments, the preliminary first metal silicide pattern may be formed to have a thickness sufficiently greater than that of a final first metal silicide pattern.

Referring to FIG. 9, the preliminary first and second metal silicide patterns may be partially etched to form a first metal silicide pattern 114a and a second metal silicide pattern 115 on the polysilicon pattern 104a. The first metal silicide pattern 114a may have a thickness smaller than that of the preliminary first metal silicide pattern. The second metal silicide pattern 114a may have a line width the same as or smaller than that of the polysilicon pattern 104a. Metal silicide residue (not illustrated) formed on the spacer 112 may be completely removed by the etch process.

The etch process may include an isotropic etch process. The etch process may be performed through a plasma dry etch process in which an etching gas is introduced under a pressure of about 50 mTorr to about 150 mTorr. In example embodiments, the preliminary first and second metal silicide patterns may be isotropically etched without applying bias to the substrate. In example embodiments, when the preliminary second metal silicide pattern is the nickel silicide pattern, examples of the etching gas may be trifluoromethane ($CHF_3$), difluoromethane ($CH_2F_2$), or fluoromethane ($CH_3F$). These may be used alone or in a combination thereof. Oxygen gas may be further used as an additional etching gas. Through the etch process, a transistor illustrated in FIG. 1 may be completed.

According to the method of example embodiments, before performing the isotropic etch process, a process of forming an etch mask pattern on the substrate on both sides of the spacer may not be performed. Further, a process of removing the etch mask pattern may not be required. Thus, a manufacturing process for forming the transistor may be simplified. However, in the isotropic etch process for forming the second metal silicide pattern, the preliminary first metal silicide pattern formed on the substrate may be etched together so that the thickness of the first metal silicide pattern making contact with the impurity region may be reduced.

Figure 10:
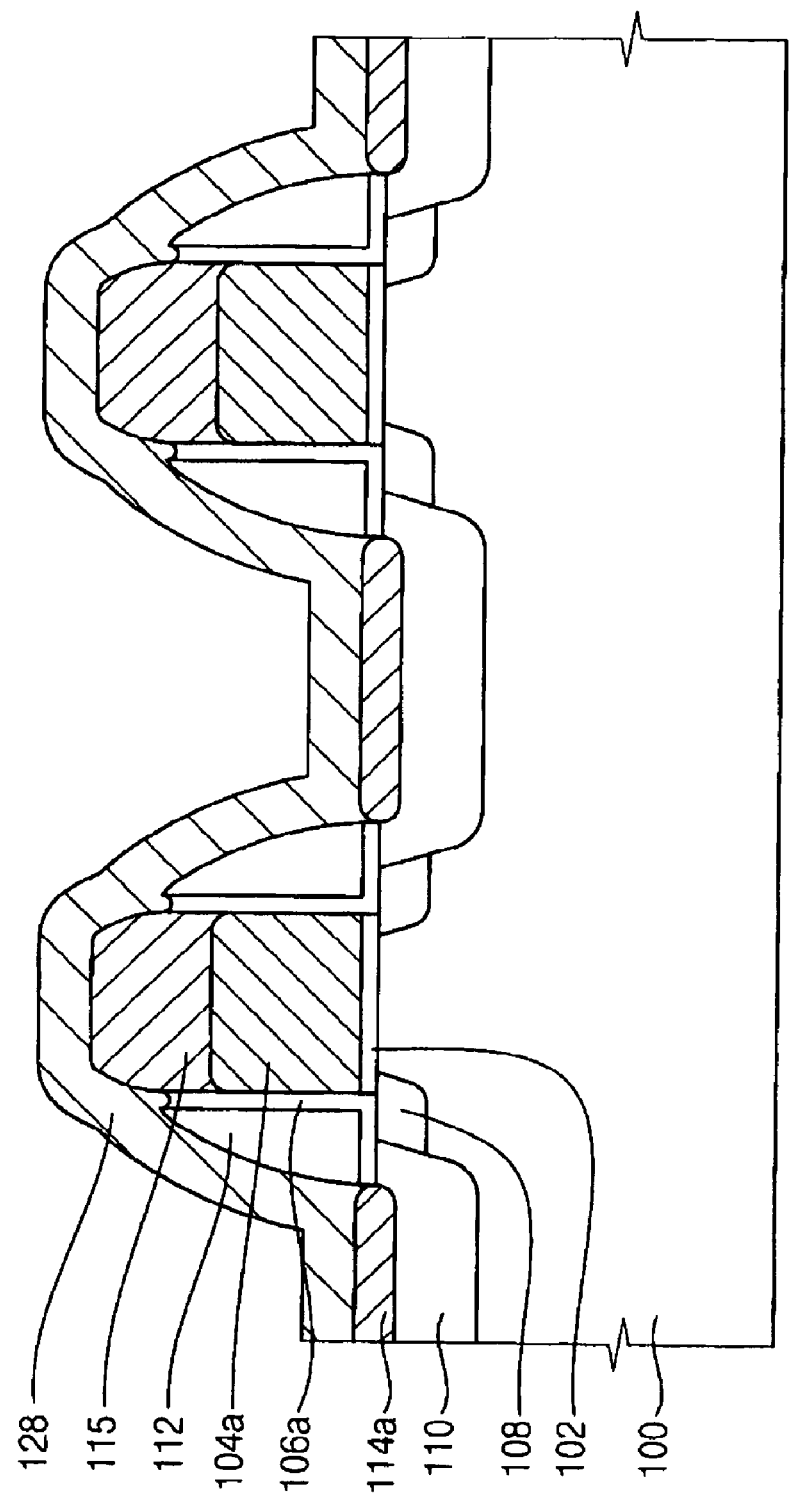
Figure 11:
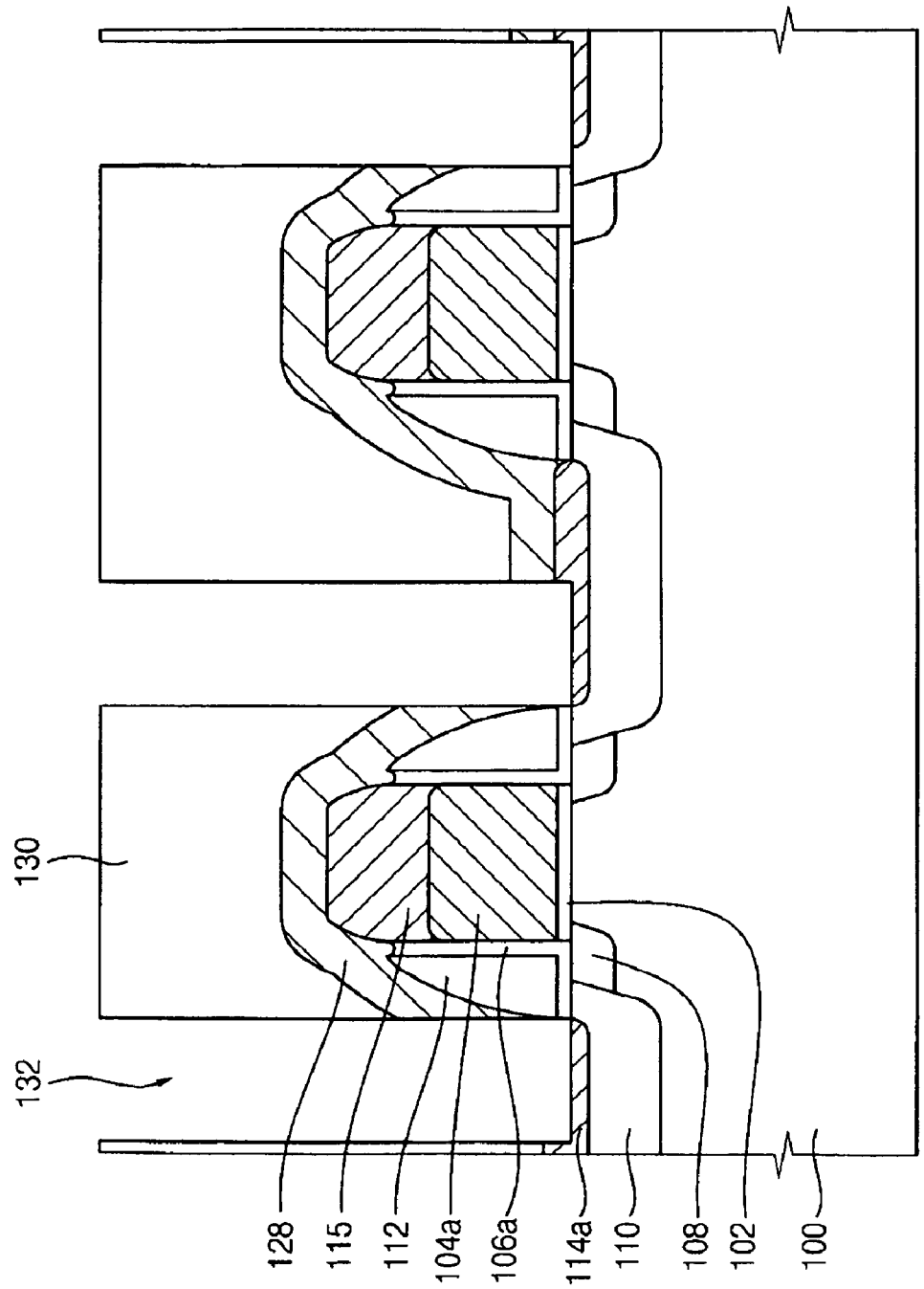
Figure 12:
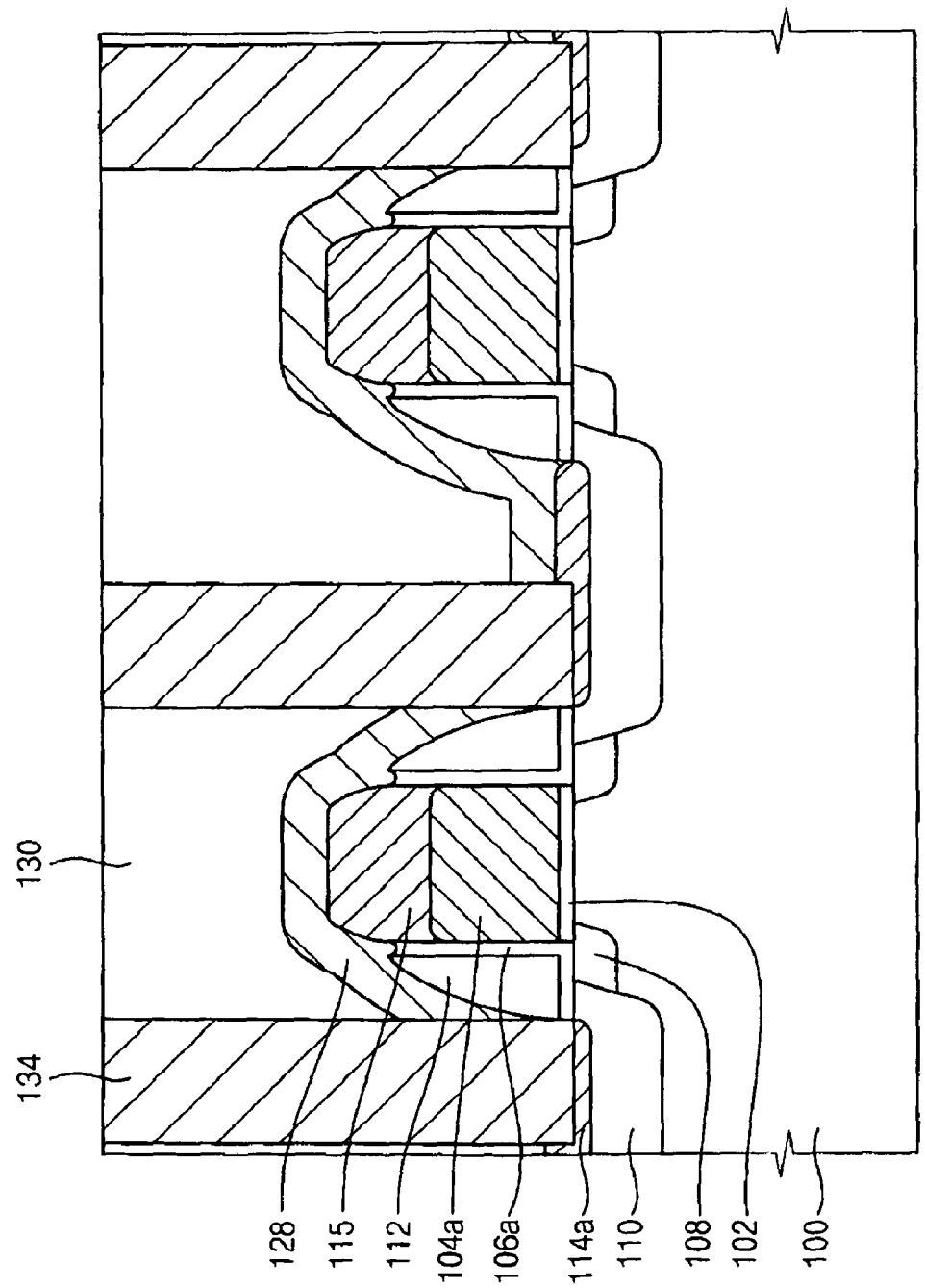

FIGS. 10 to 12 are cross-sectional views illustrating a method of manufacturing a semiconductor device in accordance with example embodiments. A method of forming a gate of a semiconductor device according to example embodiments may be the same as in FIG. 1. In example embodiments, after the processes explained in example embodiments are performed to form the gate, the following processes may be performed to form a semiconductor device.

Any processes explained with regards to FIG. 1 may be performed on a substrate 100 to form a gate including a gate insulation layer pattern 102, a polysilicon pattern 104a, an offset spacer 106a, a spacer 112 and first and second metal silicide patterns 114a and 115 on the substrate 100. Impurity regions 108 and 110 may be formed under surfaces of the substrate on both sides of the gate. A plurality of the gates may be formed repeatedly on the substrate 100.

Referring to FIG. 10, a liner layer 128 may be formed on the substrate 100, the spacer 112 and the second metal silicide pattern 115. The liner layer 128 may be formed using silicon nitride by a CVD process. The liner layer 128 may be provided to cause stress on the substrate 100 to thereby improve the mobility of electrons or holes in a channel. Further, the liner layer 28 may serve as an etch-stop layer during a following process of forming a contact hole and as a protection layer for preventing or reducing contact between a contact plug and a gate electrode to be formed subsequently.

When the liner layer 128 is less than about 200 Å, the liner layer 128 may not sufficiently serve as the stress liner and the protection layer. When the liner layer 128 is more than about 1,000 Å, a following contact hole may not be easily formed. Accordingly, the liner layer 128 may have a thickness of about 200 Å to about 1,000 Å, for example, about 400 Å to about 600 Å. In example embodiments, a process for forming the liner layer 128 may be performed. Alternatively, the process for forming the liner layer may be omitted for simplification.

Referring to FIG. 11, an insulation interlayer 130 may be formed on the liner layer 128 to sufficiently cover the gate. The insulation interlayer 120 may be formed using silicon oxide by a CVD process. A photoresist pattern (not illustrated) may be formed on the insulation interlayer 130, and the insulation interlayer 130 and the liner layer may be etched using the photoresist pattern as an etching mask to form a contact hole 132 that partially exposes a surface of the first metal silicide pattern 114a. In example embodiments, sidewalls of the contact hole 132 may be formed not to make contact with the spacer. However, as illustrated in the figure, although a misalignment occurs in a process of forming the photoresist pattern that the sidewalls of the contact hole 132 makes contact with the spacer, a short failure may not occur in following processes.

Referring to FIG. 12, conductive material may be deposited in the contact hole 132 to form a conductive layer (not illustrated). The conductive layer may include polysilicon material, or metal material. The conductive layer may be planarized by a chemical mechanical polishing (CMP) process until the upper surface of the insulation interlayer 130 is exposed to form a contact plug 134.

As illustrated in the figure, when the contact plug 134 is formed to lean to one side, in a conventional semiconductor device, a short failure between the contact plug 134 and the gate electrode may frequently occur due to metal silicide residue on the second metal silicide pattern and the spacer.

However, in a semiconductor device according to example embodiments, because the line width of the second metal silicide pattern 115 is the same as or smaller than that of the lower polysilicon pattern 104a, although the contact plug 134 is positioned to be closely adjacent to or make contact with the spacer 112, the second metal silicide pattern 115 may not make contact with the contact plug 134. Further, because the metal silicide residue on the spacer 112 is completely removed, where the metal silicide residue makes contact with the contact plug 134 to thereby cause a short failure may be prevented or reduced. As mentioned above, a transistor in accordance with example embodiments may be applied to a switching device requiring high-speed operation, e.g., a switching device included in a highly integrated semiconductor device.

The foregoing is illustrative of example embodiments and is not to be construed as limiting thereof. Although a few example embodiments have been described, those skilled in the art will readily appreciate that many modifications may be possible in example embodiments without materially departing from the novel teachings and advantages of example embodiments. Accordingly, all such modifications may be intended to be included within the scope of example embodiments as defined in the claims. In the claims, means-plus-function clauses may be intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, may be intended to be included within the scope of the appended claims.

What is claimed is:

1. A method of manufacturing a transistor, comprising:
   forming a spacer on sidewalls of a polysilicon pattern;
   forming a preliminary metal silicide pattern on a substrate and on the polysilicon pattern;
   forming an etch mask pattern to cover the preliminary metal silicide pattern on the substrate on both sides of the spacer, the etch mask pattern exposing the preliminary metal silicide pattern formed on the polysilicon pattern; and
   forming a first metal silicide pattern on the substrate and a second metal silicide pattern on the polysilicon pattern by partially etching the preliminary metal silicide pattern, the second metal silicide pattern having a line width one of the same as and smaller than that of the polysilicon pattern, the second metal silicide pattern extending beyond the spacer in a direction substantially orthogonal to the substrate.

2. The method of claim 1, wherein prior to forming the preliminary metal silicide pattern, the method further comprising:
   forming a gate insulation layer pattern and the polysilicon pattern on the substrate; and
   forming impurity regions under surfaces of the substrate on both sides of the spacer.

3. The method of claim 1, further comprising:
   forming an offset insulation layer on the polysilicon pattern and on the surface of the substrate; and
   forming a low concentration impurity region by implanting impurities under the surface of the substrate on either side of the polysilicon pattern.

4. The method of claim 1, wherein forming the etch mask pattern comprises:
   coating a mask layer on the substrate on both sides of the spacer, the mask layer including organic material used for a reflection-protection layer; and
   partially removing the mask layer by an etch-back process to expose the preliminary metal silicide pattern on the polysilicon pattern.

5. The method of claim 1, wherein forming the etch mask pattern comprises:
   coating a mask layer on the substrate on both sides of the spacer, the mask layer including photoresist; and
   partially removing the mask layer by a photolithography process to expose the preliminary metal silicide pattern on the polysilicon pattern.

6. The method of claim 1, wherein partially etching the preliminary metal silicide pattern comprises:
   removing metal silicide residue on the spacer in the lateral direction of the polysilicon pattern.

7. The method of claim 1, wherein partially etching the preliminary metal silicide pattern includes etching by an isotropic etch process.

8. A method of manufacturing a transistor, comprising:
   forming a spacer on sidewalls of a polysilicon pattern;
   forming a preliminary metal silicide pattern on a substrate and on the polysilicon pattern; and
   forming a first metal silicide pattern on the substrate and a second metal silicide pattern on the polysilicon pattern by partially etching the preliminary metal silicide pattern, the second metal silicide pattern having a line width one of the same as and smaller than that of the polysilicon pattern, the second metal silicide pattern extending beyond the spacer in a direction substantially orthogonal to the substrate, wherein partially etching the preliminary metal silicide pattern includes etching by an isotropic etch process, and the isotropic etch process includes performing a plasma dry etch process including introducing an etching gas under a pressure of about 50 mTorr to about 150 mTorr.

9. The method of claim 1, wherein the preliminary metal silicide pattern comprises any one selected from the group consisting of nickel silicide, cobalt silicide, tungsten silicide and titanium silicide.

10. The method of claim 2, wherein forming the preliminary metal silicide pattern comprises:

forming a metal layer on the polysilicon pattern, the spacer and the substrate;

reacting the metal layer with silicon to form a metal silicide on the polysilicon pattern and on the surface of the substrate; and removing unreacted metal layer from the substrate.

11. A method of manufacturing a semiconductor device, comprising:

forming a gate insulation layer pattern and a polysilicon pattern on a single-crystalline silicon substrate;

forming a spacer on sidewalls of the polysilicon pattern;

forming impurity regions by implanting impurities under surfaces of the substrate on both sides of the spacer;

forming a first metal silicide pattern on the substrate and a preliminary second metal silicide pattern on the polysilicon pattern;

forming an etch mask pattern to cover the first metal silicide pattern on the substrate, the etch mask pattern exposing the preliminary second metal silicide pattern formed on the polysilicon pattern;

forming a second metal silicide pattern on the polysilicon pattern by partially etching the preliminary second metal silicide pattern to remove metal silicide residue on the spacer in the lateral direction of the polysilicon pattern;

forming an insulation interlayer to cover the second metal silicide pattern, the spacer and the substrate; and forming a contact plug penetrating the insulation interlayer to be connected to the first metal silicide pattern.

12. The method of claim 11, wherein the etch mask pattern is formed using organic material used for a reflection-protection layer or photoresist.

13. The method of claim 11, further comprising:

removing the etch mask pattern after forming the second metal silicide pattern.

14. The method of claim 13, wherein the etch mask pattern is removed by a wet etching process and an ashing process.

15. The method of claim 11, wherein partially etching the preliminary second metal silicide pattern includes etching by an isotropic etch process.

16. A method of manufacturing a semiconductor device, comprising:

forming a gate insulation layer pattern and a polysilicon pattern on a single-crystalline silicon substrate;

forming a spacer on sidewalls of the polysilicon pattern;

forming impurity regions by implanting impurities under surfaces of the substrate on both sides of the spacer;

forming a first metal silicide pattern on the substrate and a preliminary second metal silicide pattern on the polysilicon pattern;

forming a second metal silicide pattern on the polysilicon pattern by partially etching the preliminary second metal silicide pattern to remove metal silicide residue on the spacer in the lateral direction of the polysilicon pattern;

forming an insulation interlayer to cover the second metal silicide pattern, the spacer and the substrate; and forming a contact plug penetrating the insulation interlayer to be connected to the first metal silicide pattern, wherein partially etching the preliminary second metal silicide pattern includes etching by an isotropic etch process, and the isotropic etch process includes performing a plasma dry etch process including introducing an etching gas under a pressure of about 50 mTorr to about 150 mTorr.

17. The method of claim 16, wherein the preliminary second metal silicide pattern comprises nickel silicide and the etching gas comprises at least one selected from the group consisting of trifluoromethane ($CHF_3$), difluoromethane ($CH_2F_2$) and fluoromethane ($CH_3F$) and oxygen gas.

18. The method of claim 11, further comprising:

forming a liner layer under the insulation interlayer to cover the second metal silicide pattern, the spacer and the substrate.

19. A method of manufacturing a transistor, comprising:

forming a spacer on sidewalls of a polysilicon pattern;

forming a preliminary metal silicide pattern on a substrate and on the polysilicon pattern;

forming an etch mask pattern to cover the preliminary metal silicide pattern on the substrate on both sides of the spacer, the etch mask pattern exposing the preliminary metal silicide pattern formed on the polysilicon pattern; and forming a first metal silicide pattern on the substrate and a second metal silicide pattern on the polysilicon pattern by partially etching the preliminary metal silicide pattern, the second metal silicide pattern having a line width the same as or smaller than that of the polysilicon pattern.

* * * * *